United States Patent
Jhan et al.

(10) Patent No.: US 10,847,633 B2
(45) Date of Patent: Nov. 24, 2020

(54) METHOD FOR FORMING SEMICONDUCTOR DEVICE

(71) Applicant: TAIWAN SEMICONDUCTOR MANUFACTURING CO., LTD., Hsinchu (TW)

(72) Inventors: Yi-Ruei Jhan, Keelung (TW); Yi-Lun Chen, Taichung (TW); Fang-Wei Lee, Hsinchu (TW); Han-Yu Lin, Nantou County (TW); Li-Te Lin, Hsinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/192,566

(22) Filed: Nov. 15, 2018

(65) Prior Publication Data
US 2019/0165133 A1 May 30, 2019

Related U.S. Application Data

(60) Provisional application No. 62/591,707, filed on Nov. 28, 2017.

(51) Int. Cl.
| | |
|---|---|
| H01L 21/311 | (2006.01) |
| H01L 21/768 | (2006.01) |
| H01L 21/033 | (2006.01) |
| H01L 29/66 | (2006.01) |

(52) U.S. Cl.
CPC .... *H01L 29/66545* (2013.01); *H01L 21/0337* (2013.01); *H01L 21/311* (2013.01); *H01L 21/31116* (2013.01); *H01L 21/76832* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 5,620,526 | A | 4/1997 | Watatani et al. |
| 9,548,366 | B1 * | 1/2017 | Ho ................ H01L 29/6656 |
| 2003/0049876 | A1 | 3/2003 | Mori et al. |
| 2014/0061811 | A1 | 3/2014 | Chien et al. |
| 2017/0288031 | A1 | 10/2017 | Ho et al. |
| 2019/0027373 | A1 * | 1/2019 | Kwon .............. H01L 21/02164 |

FOREIGN PATENT DOCUMENTS

| | | |
|---|---|---|
| CN | 1019474717 A | 1/2011 |
| CN | 107275281 A | 10/2017 |
| TW | 201331994 A | 8/2013 |
| TW | 201705309 A | 2/2017 |
| TW | 201715726 A | 5/2017 |
| WO | 2017176027 A1 | 10/2017 |

* cited by examiner

*Primary Examiner* — Jay C Chang
(74) *Attorney, Agent, or Firm* — Maschoff Brennan

(57) ABSTRACT

In some embodiments, a method is provided. Dummy gate stacks are formed over a semiconductor substrate. An interlayer dielectric (ILD) layer is formed over the dummy gate stacks. A first portion of the ILD layer over top surfaces of the dummy gate stacks is removed, such that a second portion of the ILD layer remains between the dummy gate stacks. The dummy gate stacks are replaced with metal gate stacks. Neutral $NF_3$ radicals into the water are applied to etch the ILD layer.

20 Claims, 16 Drawing Sheets

310

METHOD FOR FORMING SEMICONDUCTOR DEVICE

PRIORITY CLAIM AND CROSS-REFERENCE

This application claims priority to U.S. Provisional Application Ser. No. 62/591,707, filed Nov. 28, 2017, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than its previous generation. In the course of IC evolution, functional density (i.e. the number of interconnected devices per chip area) has generally increased while geometry size (i.e. the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

An etching back operation of an interlayer dielectric (ILD) layer is often performed in a semiconductor manufacturing process. However, with a decreasing dimension of a semiconductor device, a gap between two adjacent metal gate stacks becomes smaller (i.e. a higher aspect ratio). To remove the ILD layer without causing damages to the metal gate stacks, an etching operation having sufficient selectivity between the ILD layer and the metal gate stacks is required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
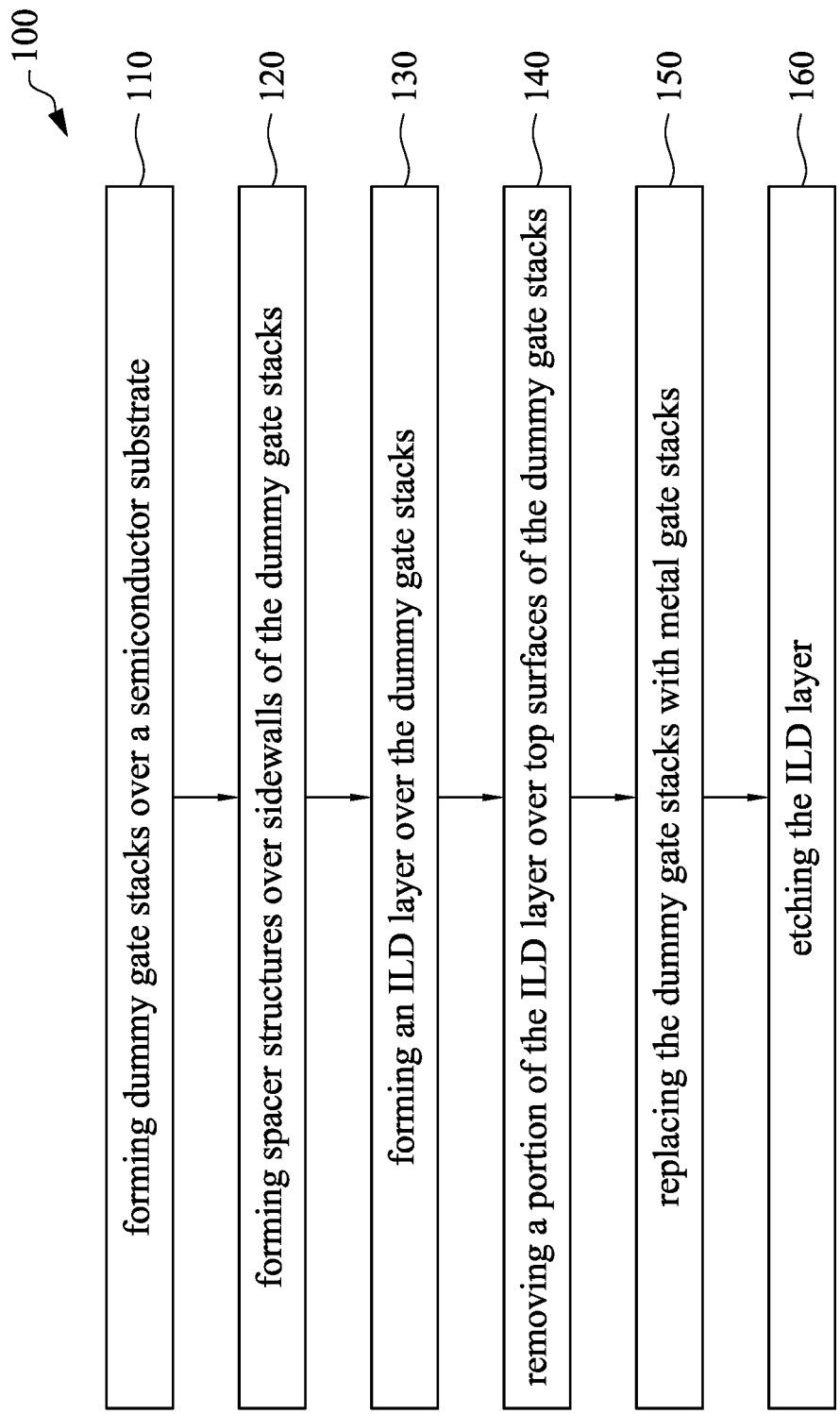
FIG. 1 is a flow chart showing a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interlayer dielectric (ILD) layer may be formed between adjacent metal gate stacks to provide electrical isolation between the adjacent metal gate stacks. The ILD layer may be formed using a deposition operation followed by an etching operation that is used to remove the excess ILD layer. During the etching operation, while a portion of the ILD layer is being removed by an etchant, a solid byproduct (e.g. ammonium fluorosilicate (AFS)) may also be formed on a surface of the remaining ILD layer, and thus further etching of the ILD layer is inhibited by the solid byproduct. For further etching the ILD layer to remove a predetermined portion of the ILD layer, an evaporation operation (or a byproduct-removing operation) is performed to remove the solid byproduct. Accordingly, the overall etching operation is interrupted, thus causing a poor efficiency of the etching operation. However, with the advance of the technology node, a width (i.e. a critical dimension) of a gap (or a spacing) between two adjacent gates narrows down, which leads to a higher aspect ratio that makes the removal of the solid byproduct of the etching operation more difficult. When the solid byproduct accumulates in the gap between the adjacent metal gate stacks, performance of a semiconductor device including the metal gate stacks will be significantly affected.

In addition, a fluoride is used as the etchant in the etching operation and causes a poor selectivity between the ILD layer and a spacer structure (which is formed from such as silicon nitride, silicon carbide, silicon oxycarbonitride (SiOCN), or the like or combinations thereof). Such poor selectivity results in undesired removal of a portion of the spacer structure (e.g. a decrease of height of the spacer structure) during the etching operation. Also, a gate height loss is likely to occur with the poor selectivity of the etching operation.

Embodiments of the present disclosure are directed to providing a method for etching an ILD layer between two metal gate stacks each of which is peripherally enclosed by a spacer structure and a method of forming a semiconductor device. More particularly, the method includes an etching operation using an etchant formed from water and neutral $NF_3$ radicals to form recesses in the ILD layer. In some embodiments, the water is provided as a water film on top surfaces of the metal gate stacks, the spacer structures and the ILD layer to protect the metal gate stacks and the spacer structures. The neutral $NF_3$ radicals are then injected through the water film to form the etchant (i.e. $HF_2^-$ ions). The etchant removes a portion of the ILD layer, and gaseous byproducts are formed during the etching operation. Sufficient selectivity of the ILD layer to the metal gate stacks and the spacer structures is achieved in the etching operation, and thus damages of the spacer structures and the metal gate stacks may be reduced. In addition, the gaseous byproducts do not accumulate in the gap having the higher aspect ratio between the adjacent metal gate stacks, and may be removed at the end of the etching operation without interrupting the etching operation.

Figures 3A, 3B:
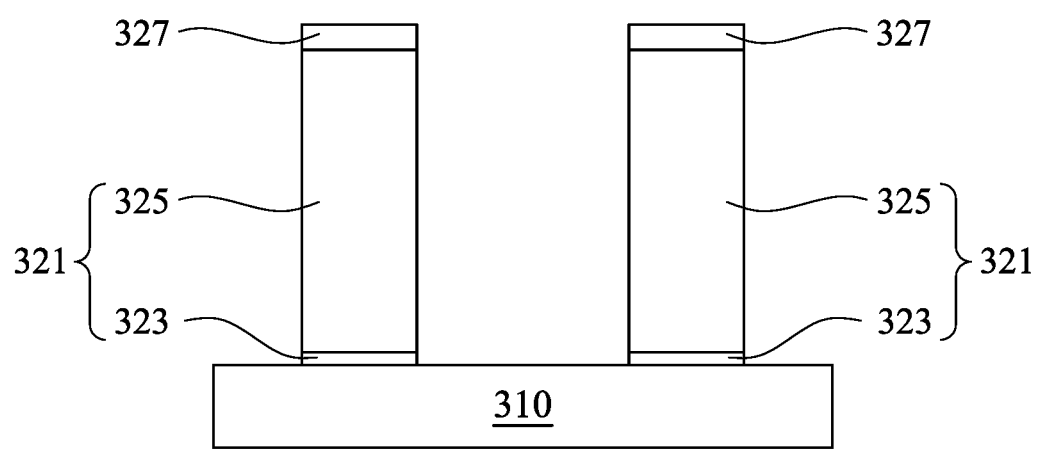
FIG. 3A to FIG. 3P are schematic cross-sectional views of intermediate stages showing a method for forming a semiconductor device in accordance with some embodiment of the present disclosure.
Figure 3C:
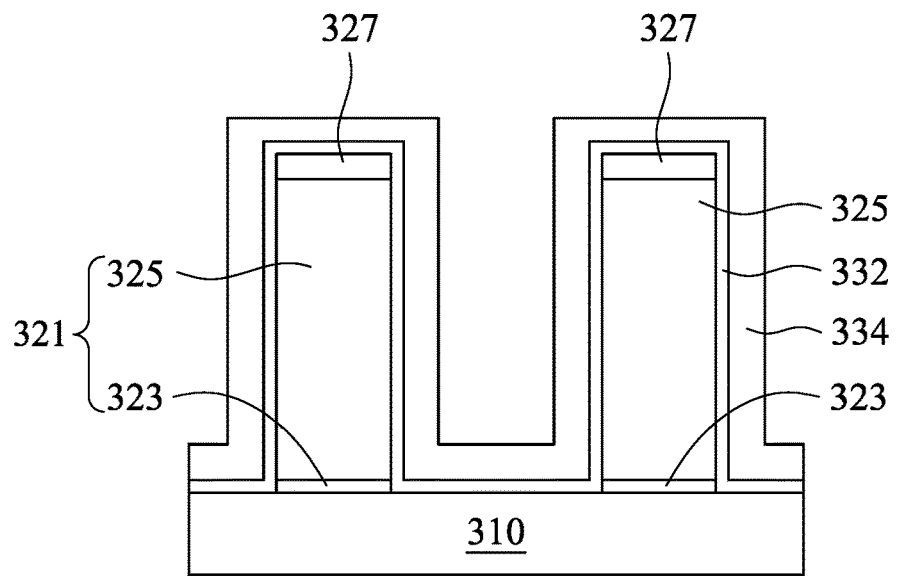
Figure 3D:
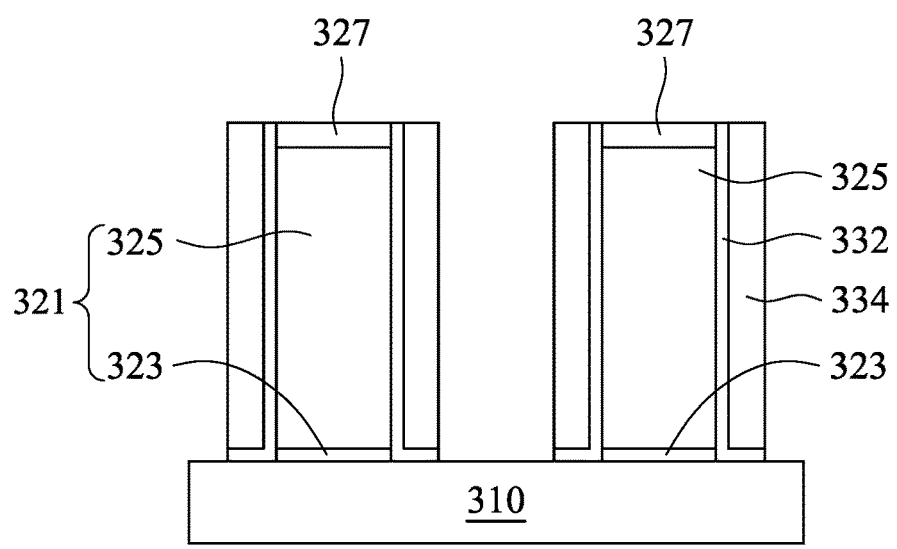

FIG. 1 is a flow chart showing a method 100 of forming a semiconductor device in accordance with some embodiments of the present disclosure. FIG. 3A through FIG. 3P show various intermediate stages of forming the semiconductor device in accordance with some embodiments of the present disclosure. Reference is made to FIG. 1. At operation 110, dummy gate stacks are formed over a semiconductor substrate. Reference is made to FIG. 3A. A semiconductor substrate 310 is provided. In some embodiments, the semiconductor substrate 310 includes a bulk silicon substrate. The semiconductor substrate 310 may include silicon in a crystalline structure. In some other embodiments, the semiconductor substrate 310 may include other suitable semiconductors, such as germanium, or include a compound semiconductor, such as silicon carbide, gallium arsenide, indium arsenide, indium phosphide, or combinations thereof. In yet some other embodiments, the semiconductor substrate 310 includes a silicon-on-insulator (SOI) substrate. The SOI substrate may be fabricated using separation by implantation of oxygen, wafer bonding, and/or other suitable methods.

Reference is made to FIG. 3B. Two dummy gate stacks 321 are formed over the semiconductor substrate 310. In some embodiments, the dummy gate stacks 321 may be formed by sequentially forming an interfacial layer 323, a dummy gate material layer 325, and a mask layer 327, followed by patterning the mask layer 327, the dummy gate material layer 325, and the interfacial layer 323. In some embodiments, the interfacial layer 323 includes silicon oxide, silicon nitride, silicon oxynitride, other suitable materials, or combinations thereof. In some embodiments, the dummy gate material layer 325 includes polycrystalline-silicon (poly-Si), other suitable materials, or combinations thereof. In some embodiments, the mask layer 327 includes silicon oxide, silicon nitride, silicon oxynitride, other suitable materials, or combinations thereof. In some embodiments, formation of the interfacial layer 323, the dummy gate material layer 325, and the mask layer 327 may include one or more deposition processes, such as chemical vapor deposition (CVD), physical vapor deposition (PVD), sputter deposition, other suitable techniques, or combinations thereof.

Reference is made to FIG. 1 again. At operation 120, spacer structures are formed over sidewalls of the dummy gate stacks. Formation of the spacer structures 330 (FIG. 3E) may include the following operations. Reference is made to FIG. 3C and FIG. 3D. First, a liner layer 332 is conformally deposited over the dummy gate stacks 321 and the semiconductor substrate 310. Then, a spacer layer 334 is deposited over the liner layer 332, followed by an anisotropic etching process to remove portions of the spacer layer 334 and the liner layer 332 (FIG. 3D). In some embodiments, the liner layer 332 and the spacer layer 334 may be deposited by plasma enhanced chemical vapor deposition (PECVD), low-pressure chemical vapor deposition (LPCVD), sub-atmospheric chemical vapor deposition (SACVD), or the like. In some embodiments, the anisotropic etching process may be performed by a dry etching operation.

Figure 3E:
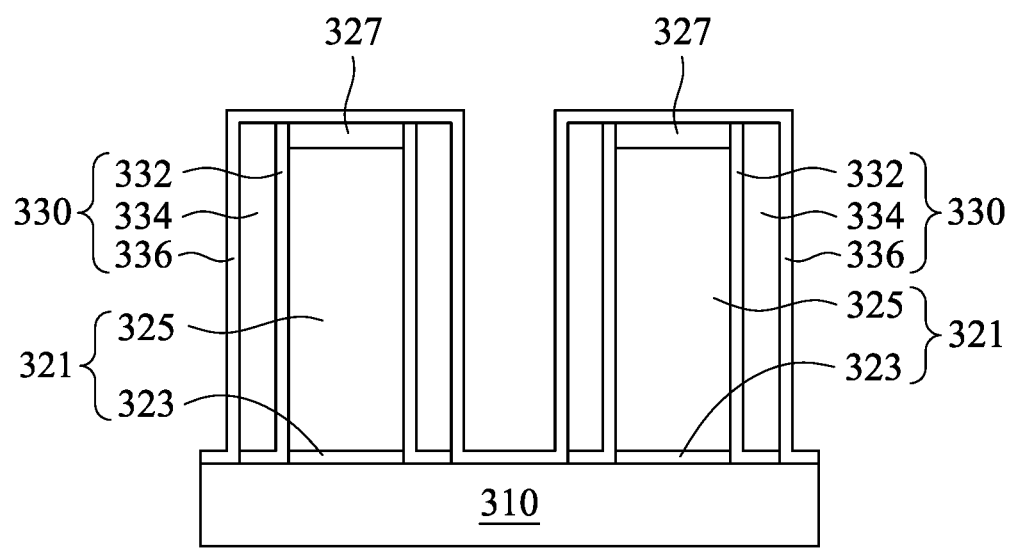

Reference is made to FIG. 3E. A contact etch stop layer (CESL) 336 is conformally deposited over the etched spacer layer 334, the etched liner layer 332, the dummy gate stacks 321, and the semiconductor substrate 310, so as to form the spacer structures 330. A top portion of the CESL 336 may be removed in the subsequent operations. In some embodiments, the liner layer 332, the spacer layer 334 and the CESL 336 of the spacer structures 330 may include silicon nitride, silicon carbide, silicon carbon nitride, SiOCN with a high carbon concentration (greater than about 2 at. %), other suitable materials, or combinations thereof. In some embodiments, the liner layer 332 has a carbon concentration higher than that of the spacer layer 334, and the spacer layer 334 has a carbon concentration higher than that of the CESL 336. A configuration of the spacer structures 330 may be modified or changed depending on the requirements and the design of the semiconductor device, and the example illustrated herein is only for clear understanding of some embodiments of the present disclosure.

Figure 3F:
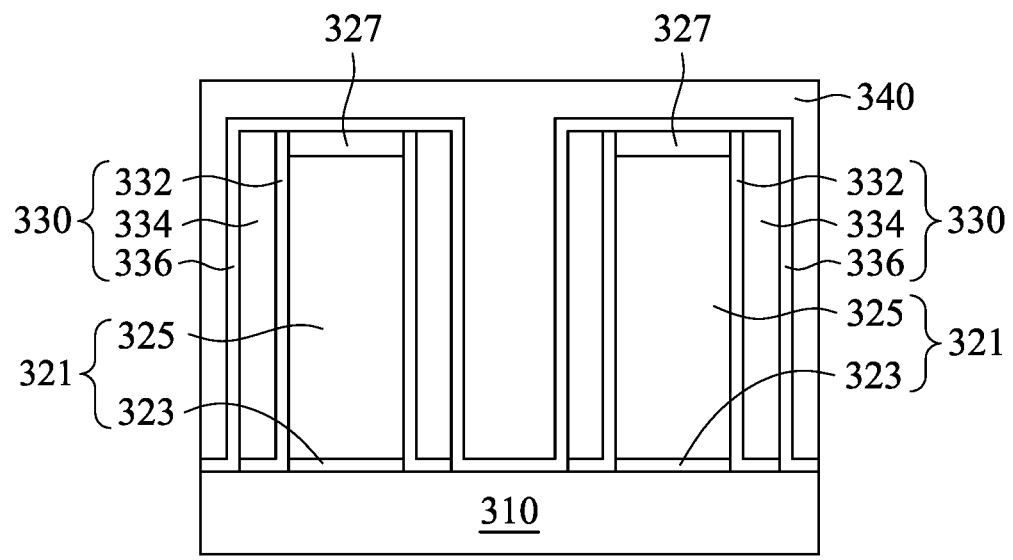

Reference is made to FIG. 1 again. At operation 130, an interlayer dielectric (ILD) layer is formed over the dummy gate stacks. Reference is made to FIG. 3F, after depositing the CESL 336, an ILD layer 340 is formed to cover the CESL 336 over the dummy gate stacks 321. In some embodiments, the ILD layer 340 may be formed by, for example, atomic layer deposition (ALD), CVD, spin-on-glass (SOG), other suitable techniques, or combinations thereof. In some embodiments, the ILD layer 340 may include silicon oxide, SiOCN with a low carbon concentration (smaller than or equal to about 2 at. %), other suitable materials, or combinations thereof.

In some embodiments, the spacer structures 330 (including the liner layer 332, the spacer layer 334, and/or the CESL 336) and the ILD layer 340 may include SiOCN with different carbon concentrations. In some embodiments, the ILD layer 340 may have a carbon concentration lower than that of one or each of the liner layer 332, the spacer layer 334, and the CESL 336. In some embodiments, the carbon concentration of the ILD layer 340 is substantially greater than 0 at. % and smaller than or equal to about 2 at. %. On the other hand, the carbon concentration of one or each of the liner layer 332, the spacer layer 334, and the CESL 336 is greater than about 2 at. %.

In some embodiments, the ILD layer 340 has an oxygen concentration higher than that of one or each of the liner layer 332, the spacer layer 334, and the CESL 336. In some embodiments, the oxygen concentration of the ILD layer 340 may be greater than or equal to about 30 at. %. In some embodiments, the oxygen concentration of the ILD layer 340 may be in a range from about 50 at. % to about 60 at. %. In some embodiments, a difference between the oxygen concentration of the ILD layer 340 and the oxygen concentration of one or each of the liner layer 332, the spacer layer 334, and the CESL 336 is greater than or equal to about 3 at. %. When the carbon concentration of the ILD layer 340 is greater than about 2 at. %, the carbon concentration of one or each of the liner layer 332, the spacer layer 334, and the CESL 336 is less than or equal to about 2 at. %, the oxygen concentration of the ILD layer 340 is less than about 30 at. %, or the difference between the oxygen concentration of the ILD layer 340 and the oxygen concentration of one or each of the liner layer 332, the spacer layer 334, and the CESL 336 is less than about 3 at. %, the etching operation to etch the ILD layer 340 (described later) might have insufficient selectivity of the ILD layer 340 to the spacer structures 330, and the spacer structures 330 might be damaged during the etching operation.

Figure 3G:
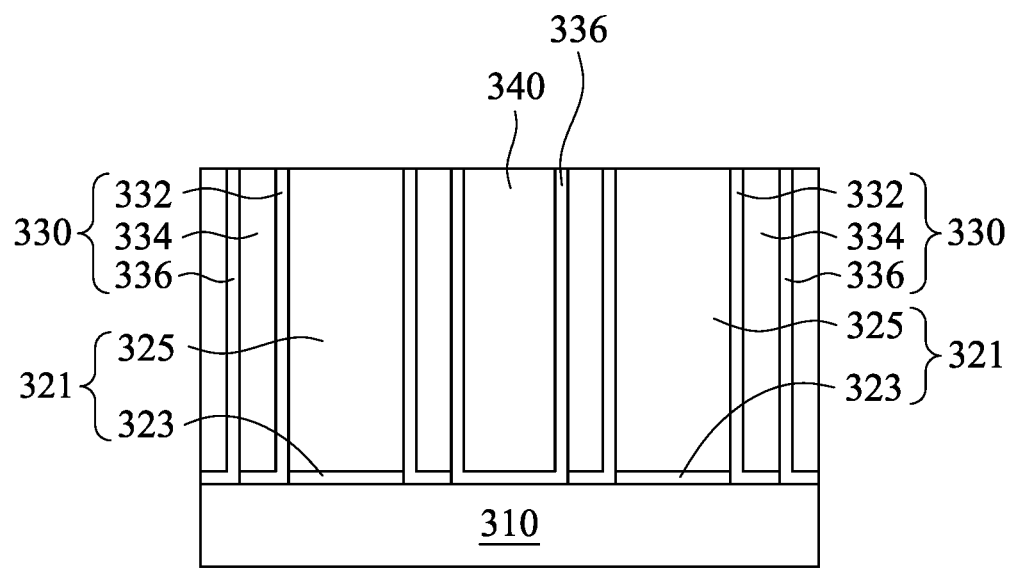

Reference is made to FIG. 1 again. At operation 140, a portion of the ILD layer over top surfaces of the dummy gate stacks is removed. Reference is made to FIG. 3G, a chemical mechanical planarization (CMP) process may be performed to remove the mask layer 327 as well as portions of the CESL 336 and the ILD layer 340 over the top surfaces of the dummy gate stacks 321, thereby exposing the top surfaces of the dummy gate stacks 321.

Figure 3H:
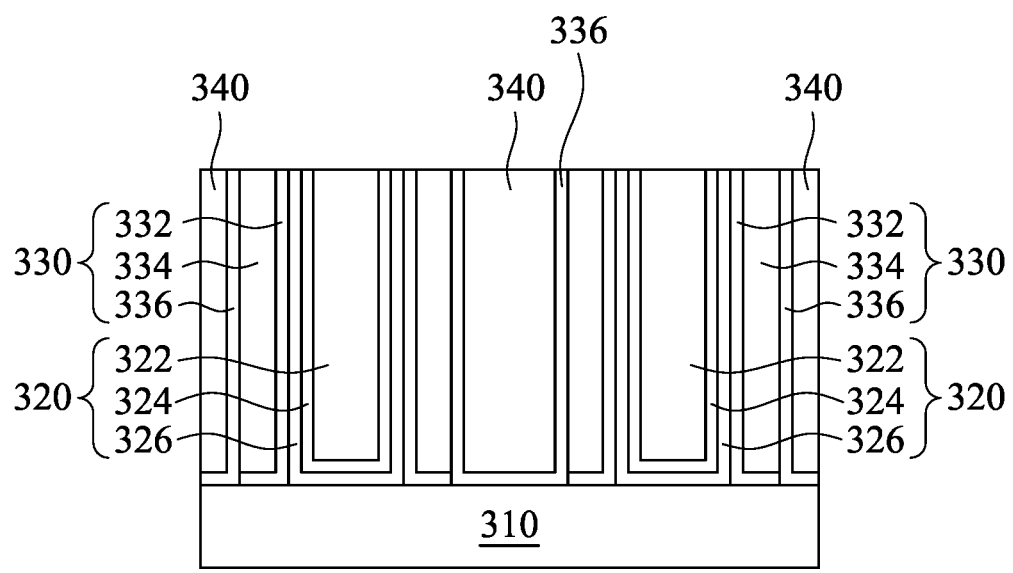

Reference is made to FIG. 1. At operation 150, the dummy gate stacks are replaced with metal gate stacks. Reference is made to FIG. 3G and FIG. 3H. The dummy gate stacks 321 may be replaced with metal gate stacks 320 having a metal gate layer 322, a work function metal layer 324 and a gate dielectric layer 326 wrapping around the metal gate layer 322. In some embodiments, the dummy gate stacks 321 are removed by performing a first etching process and performing a second etching process after the first etching process. In some embodiments, the dummy gate material layer 325 is mainly removed by the first etching process, and the interfacial layer 323 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the first etching process is performed at a pressure in a range from about 1 mTorr to about 100 mTorr. In some embodiments, the first etching process is performed at a power in a range from about 50 W to about 1500 W. In some embodiments, the second etching process is not performed, so the interfacial layer 323 remains over the semiconductor substrate 310 after removal of the dummy gate stacks 321.

After the dummy gate stacks 321 are removed to form gate trenches (not shown), the gate dielectric layer 326 may be conformally deposited into the gate trenches. In some embodiments, the gate dielectric layer 326 may formed of a material including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), barium strontium titanate ($Ba_xSr_{1-x}TiO_3$, BST), wherein x is between 0 and 1, other suitable materials, or combinations thereof. The gate dielectric layer 326 is formed by a deposition process, such as an ALD process, a CVD process, a PVD process, a sputter deposition process, other suitable processes, or combinations thereof.

After deposition of the gate dielectric layer 326, the work function metal layer 324 is conformally deposited over the gate dielectric layer 326. In some embodiments, the work function metal layer 324 may include one or more n-type work function metals (N-metal) for forming an n-type transistor on the semiconductor substrate 310. The n-type work function metals may exemplarily include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, other suitable materials, or combinations thereof. In alternative embodiments, the work function metal layer 324 may include one or more p-type work function metals (P-metal) for forming a p-type transistor on the semiconductor substrate 310. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, other suitable materials, or combinations thereof.

Afterwards, the metal gate layer 322 is formed over the work function metal layer 324. In some embodiments, the metal gate layer 322 may include Al, W, Co, Cu, other suitable materials, or combinations thereof, and may be formed by PVD, CVD, other suitable processes, or combinations thereof. Thereafter, a CMP process may be performed to remove excessive materials of the metal gate layer 322, the work function metal layer 324, and the gate dielectric layer 326 outside the gate trenches.

Figure 3I:
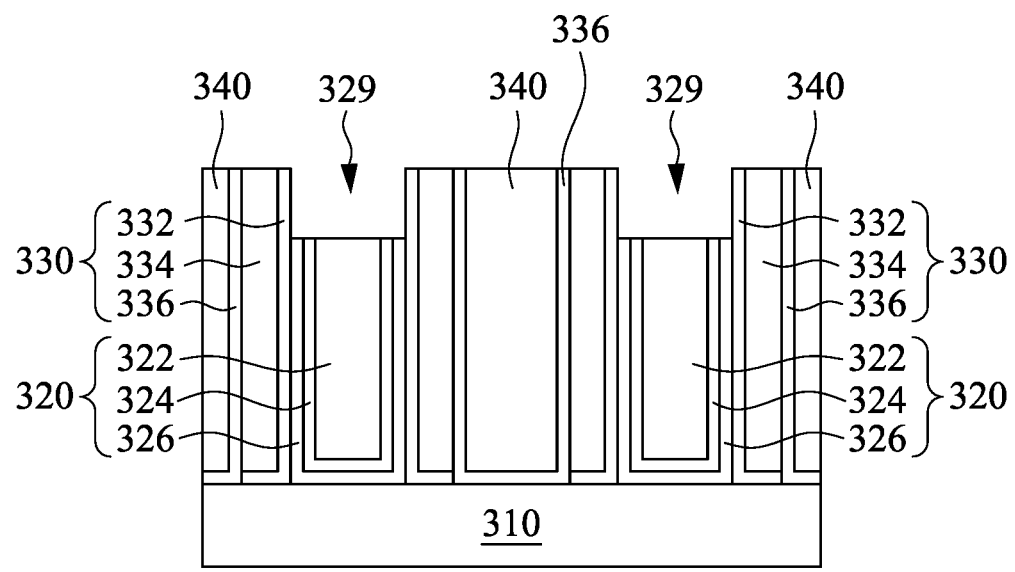

Reference is made to FIG. 3I. Upper portions of the metal gate layer 322, the work function metal layer 324, and the gate dielectric layer 326 are etched back to define recesses 329 in the metal gate stacks 320. In some embodiments, the etching back operation of the metal gate stacks 320 is a wet etch process.

Figure 3J:
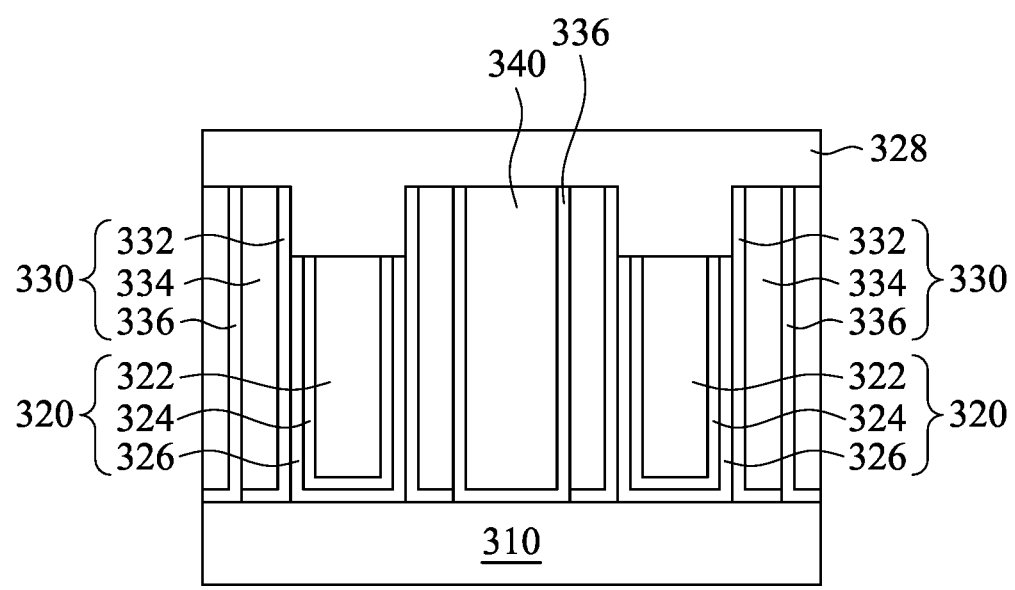
Figure 3K:
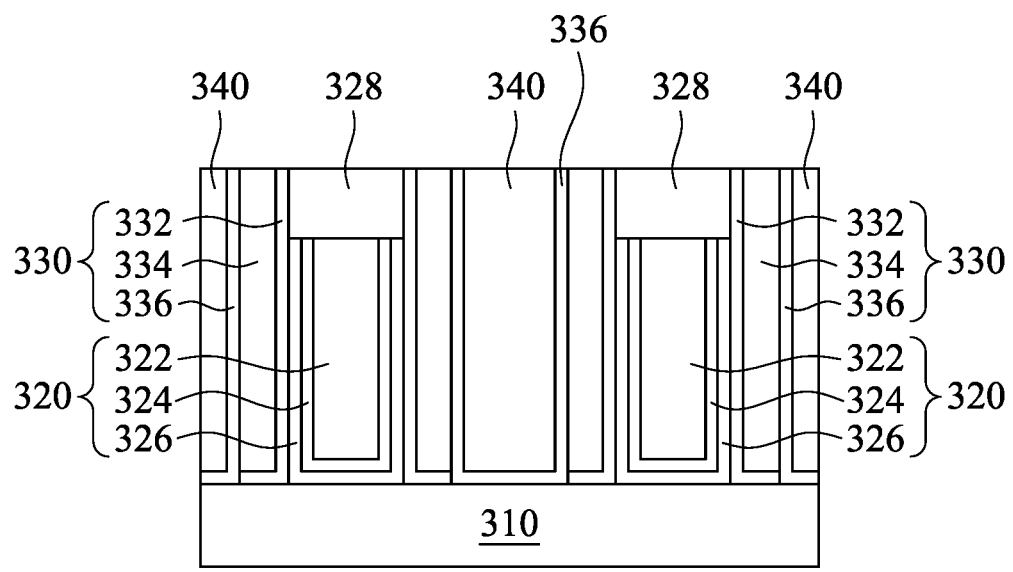

Reference is made to FIG. 3J. A hard mask layer 328 is formed over the ILD layer 340 and fills the recesses 329 (FIG. 3I) in the metal gate stacks 320. The hard mask layer 328 may include SiOCN having a nitrogen concentration in a range from about 30 at. % to about 40 at. %, such that the hard mask layer 328 will not being damaged in the subsequent ILD etching operation. Then, as shown in FIG. 3K, an excess portion of the hard mask layer 328 is removed, such that a top surface of the hard mask layer 328 is substantially coplanar with top surfaces of the spacer structures 330.

Figure 2:
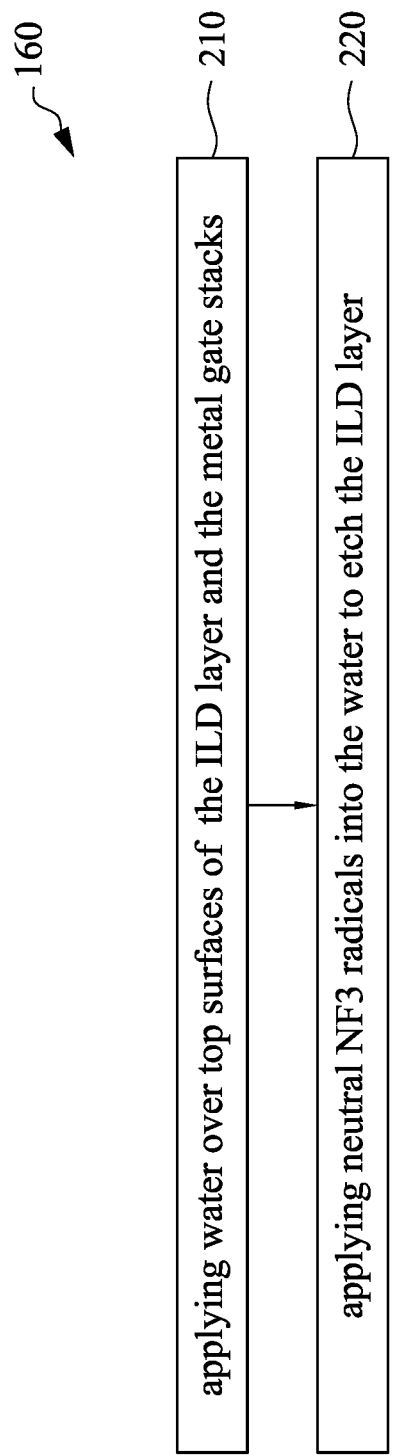
FIG. 2 is a flow chart showing intermediate stages for etching an ILD layer in accordance with some embodiments of the present disclosure.
Figure 3L:
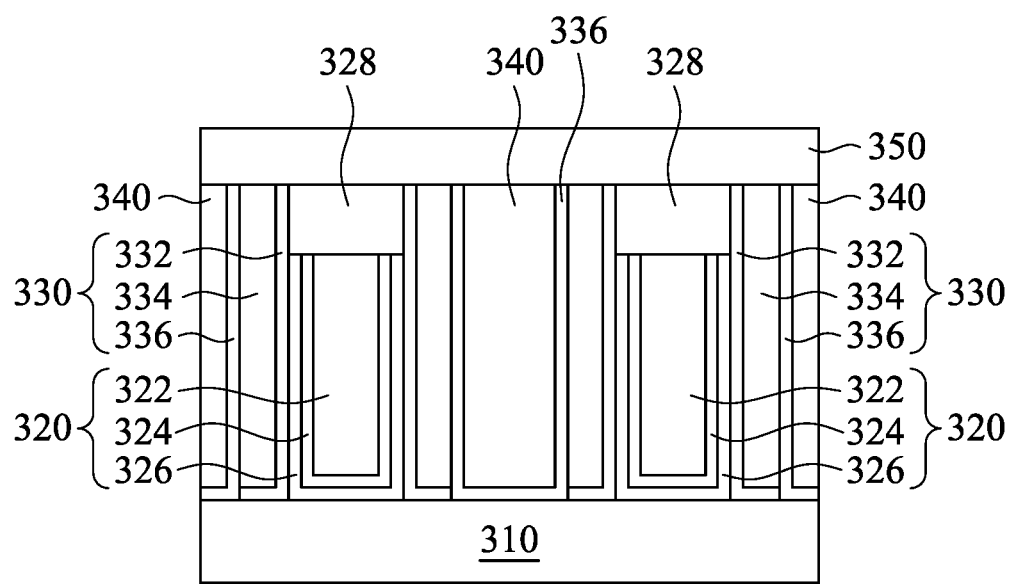

Reference is made to FIG. 1. At operation 160, the ILD layer is etched. For example, the ILD layer 340 may be etched by operations shown as follows. Reference is made to FIG. 2. FIG. 2 is a flow chart showing intermediate stages for etching the ILD layer 340 in accordance with some embodiments of the present disclosure. At operation 210, water is applied over top surfaces of the ILD layer and the metal gate stacks. Reference is made to FIG. 3L. In some embodiments of the operation 210, a water film 350 is formed over the top surfaces of the ILD layer 340, the metal gate stacks 320 (e.g. on the hard mask layer 328), and the spacer structures 330. In some embodiments, the water film 350 includes a film of liquid water or water vapor. In some embodiments, forming the water film 350 includes applying the water over the top surfaces of the ILD layer 340, the metal gate stacks 320 (i.e. on the hard mask layer 328) and the spacer structures 330, such that the water is in direct contact with ILD layer 340, the spacer structures 330 and the hard mask layer 328. The water film 350 protects the hard mask layer 328 and the spacer structures 330 from being in direct contact with the neutral $NF_3$ radicals which will be applied later, in which the direct contact may cause damages to the hard mask layer 328 and the spacer structure 330.

Figure 3M:
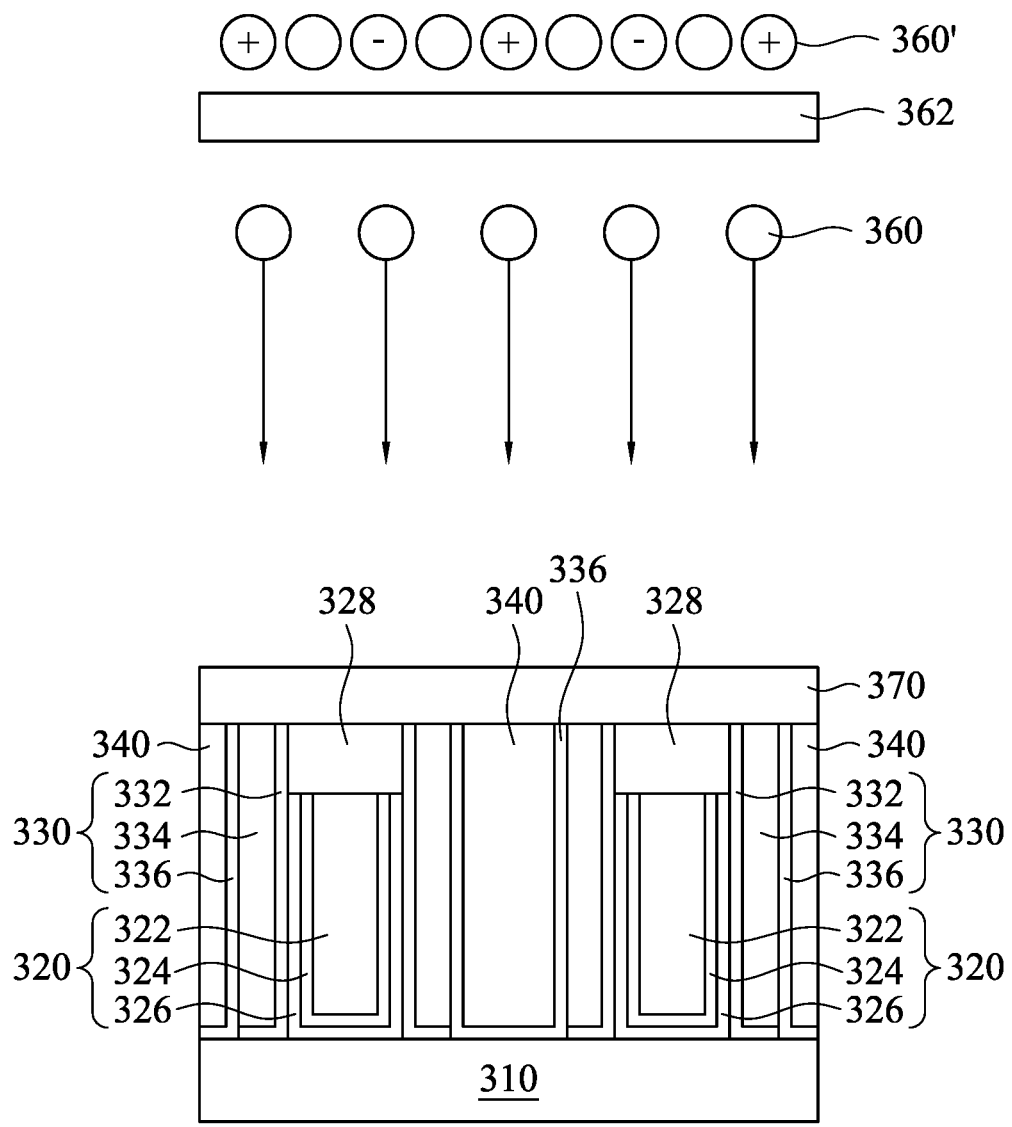
Figure 3N:
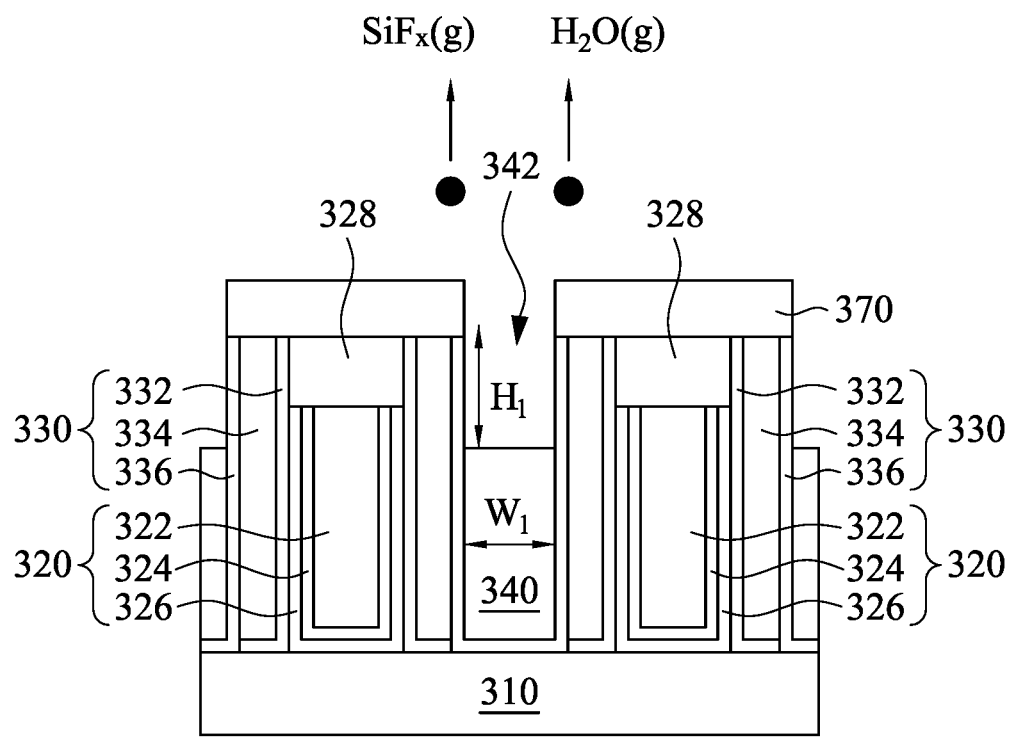

Reference is made to FIG. 2 again. At operation 220, neutral $NF_3$ radicals are applied into the water to etch the ILD layer. Reference is made to FIG. 3L and FIG. 3M. In some embodiments of the operation 220, neutral $NF_3$ radicals 360 are formed and injected into the water film 350, thereby forming $HF_2^-$ ions over the top surfaces of the ILD layer 340, the hard mask layer 328 and the spacer structure 330, such that a portion of the ILD layer 340 is selectively removed by an etching operation using the $HF_2^-$ ions (FIG. 3N). In other words, a $HF_2^-$ ion film 370 including the $HF_2^-$ ions is formed from the water film 350 to remove the portion of the ILD layer 340. In some embodiments, the neutral $NF_3$ radicals 360 may react with the water film 350 according to formula (I) when being injected into the water film 350, and $HF_2^-$ ions may be formed as the etchant of the etching operation. The etching operation performed by the $HF_2^-$ ions has a high selectivity of the ILD layer 340 to the hard mask layer 328 and the spacer structures 330. In some embodiments, a flow rate of the water is in a range from about 1 gm to about 3 gm, and a flow rate of the neutral $NF_3$ radicals is in a range from about 30 sccm to about 140 sccm. When the flow rate of the water is greater than about 3 gm, the water might accumulate over the semiconductor substrate 310 and might be difficult to be completely removed; while when the flow rate of the water is less than about 1 gm, the water film 350 might not provide sufficient protection to its underlying structure. When the flow rate of the neutral $NF_3$ radicals is greater than about 140 sccm, the etch selectivity of the ILD layer 340 to the hard mask layer 328 and the spacer structures 330 might be insufficient; while when the flow rate of the neutral $NF_3$ radicals is less than about 30 sccm, the ILD layer 340 might not be etched. In some embodiments, the etching operation may be performed at a temperature in a range from about 0° C. to about 110° C. Because the etching operation is an exothermic reaction, the reaction rate might increase in a low temperature. When the temperature of the etching operation is lower than about 0° C., the spacer structures 330 and the hard mask layer 328 might be damaged because the etch selectivity of the ILD layer 340 to the hard mask layer 328 and the spacer structures 330 might be insufficient; while when the temperature of the etching operation is higher than about 110° C., the ILD layer 340 might not be etched.

$$NF_3 + H_2O \rightarrow HF_2^- + H_3O^+ \qquad (I).$$

In some embodiments, the neutral $NF_3$ radicals may be formed by performing a plasma forming operation (e.g. at a frequency in a range from about 13 MHz to about 14 MHz) to $NF_3$ to form a $NF_3$ plasma 360' and then removing charged $NF_3$ ions from the $NF_3$ plasma 360'. In some embodiments, $NF_3$ radicals and charged $NF_3$ ions are formed by the plasma forming operation, and then the charged $NF_3$ ions are removed from the $NF_3$ plasma 360' by a metal filter 362 (i.e. selectivity modulation device). The metal filter 362 is coupled to the ground to filter out the charged $NF_3$ ions, as shown in FIG. 3M.

Reference is made to FIG. 3N. An upper portion of the ILD layer 340 is removed to form recesses 342 by the $HF_2^-$ ions of the $HF_2^-$ ion film 370. The spacer structures 330 and the hard mask layer 328 remain substantially unetched because the $HF_2^-$ ions have a high etch selectivity of the ILD layer 340 to the hard mask layer 328 and the spacer structure 330. In some embodiments, the ILD layer 340 is etched at a first etching rate, the spacer structures 330 (including the liner layer 332, the spacer layer 334, and/or the CESL 336) are etched at a second etching rate, a ratio of the first etching rate to the second etching rate (i.e. the etch selectivity) is greater than about 30. In some other embodiments, the ILD layer 340 is etched at a first etching rate, the hard mask layer 328 is etched at a third etching rate, a ratio of the first etching rate to the third etching rate (i.e. the etch selectivity) is greater than about 30.

In some embodiments, gaseous byproducts are formed when the ILD layer 340 is removed by the $HF_2^-$ ion film 370, as shown in FIG. 3N. In some embodiments, the gaseous byproducts include water vapor and gaseous fluoride. In the embodiments where the ILD layer 340 is made of $SiO_2$, the gaseous byproducts are gaseous silicon fluoride and water vapor according to formula (II). Without formation of the solid byproduct, the etching operation is not interrupted by the solid byproduct.

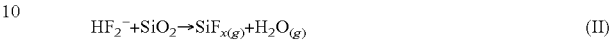

$$HF_2^- + SiO_2 \rightarrow SiF_{x(g)} + H_2O_{(g)} \qquad (II)$$

In some embodiments, after the water film 350 is formed, the etching operation further includes continually applying the water and the neutral $NF_3$ radicals until the upper portion of the ILD layer 340 is removed. Specifically, the water and the neutral $NF_3$ radicals are applying simultaneously and continually after the water film 350 is formed. If the water and the neutral $NF_3$ radicals are applied simultaneously without the existence of the water film 350, the spacer structures 330 and the hard mask layer 328 may be damaged by the neutral $NF_3$ radicals. Furthermore, the water and the neutral $NF_3$ radicals are terminated to stop removal of the ILD layer 340 when a depth of the recess 342 reaches a predetermined depth. In some embodiments, the water and the neutral $NF_3$ radicals are terminated after the etching operation is performed for about 60 seconds to about 300 seconds. When the etching operation is performed for less than about 60 seconds, the predetermined depth might not be reached; while when the etching operation is performed for more than about 300 seconds, the spacer structures 330 might be damaged. In some embodiments, the water and the neutral $NF_3$ radicals are terminated when a bottom of the recess 342 is lower than a top surface of the metal gate layer 322. In some embodiments, a top surface of the spacer structures 330 is substantially coplanar with a top surface of the hard mask layer 328 after the etching operation.

In some embodiments, the recess 342 formed between two metal gate stacks 320 may have a width $W_1$ smaller than about 15 nm and a depth $H_1$ greater than about 80 nm. In other words, the recess 342 may have an aspect ratio greater than about 5. The etching operation shown in FIG. 3L to FIG. 3N is suitable for etching back the ILD layer 340 to form such recess 342, and the high selectivity of the ILD layer 340 to the spacer structures 330 and the mask layer 328 can be achieved. In some other embodiments, the etching operation can be also applied to form a recess having a lower aspect ratio (e.g. less than or equal to about 5).

Figure 3O:
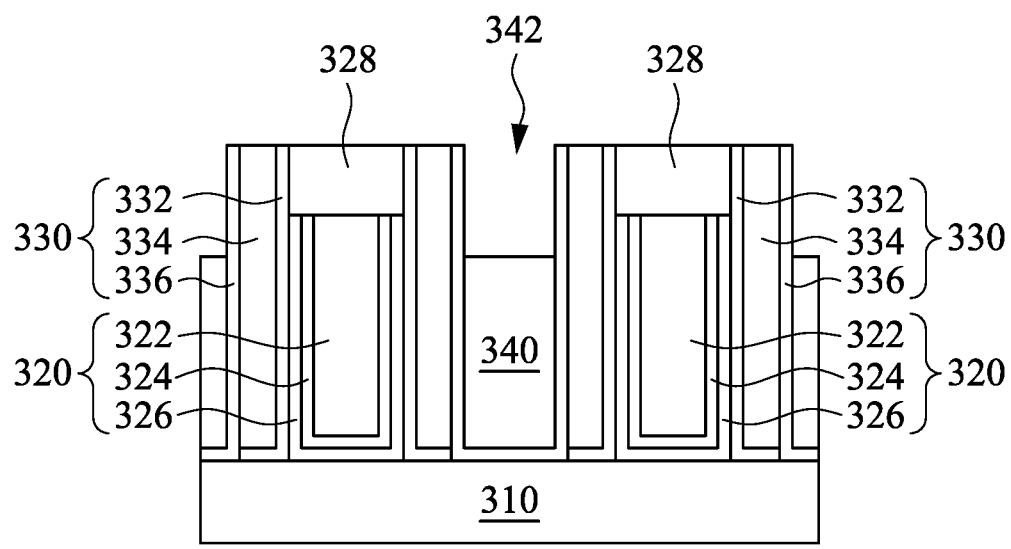
Figure 3P:
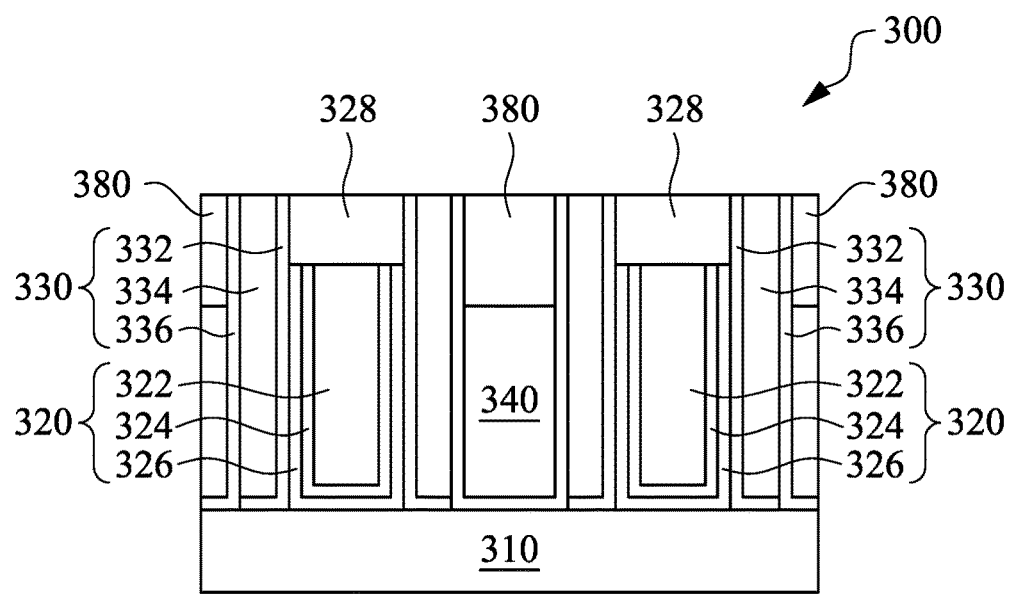

As shown in FIG. 3O, in some embodiments, the method may further include a purge process to remove the gaseous byproducts and the remaining etchant (i.e. the $HF_2^-$ ions) after the etching operation is performed. In some embodiments, a gas used for the purge process may include a nitrogen gas ($N_2$).

As shown in FIG. 3P, a dielectric layer 380 may be deposited over the ILD layer 340 after the etching operation, so as to form a semiconductor device 300. In some embodiments, the excess dielectric layer 380 over the top surface of the hard mask layer 328 is removed, such that a top surface of the dielectric layer 380 is substantially coplanar with the top surface of the hard mask layer 328. In some embodiments, the dielectric layer 380 includes SiOCN, SiCN, SiON, SiN, SiOC, other suitable material, or combinations thereof.

Figure 4A:
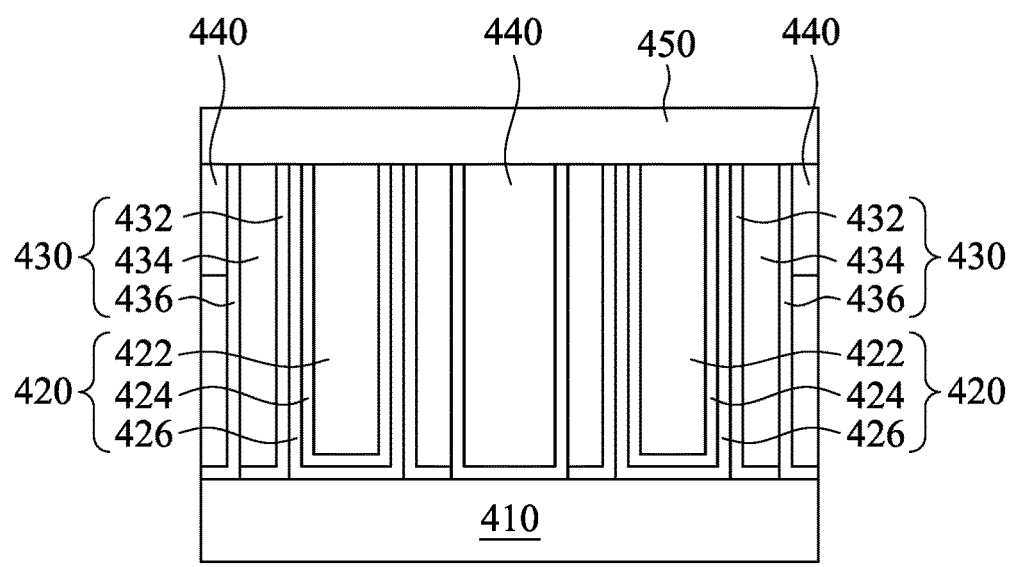
FIG. 4A to FIG. 4E are schematic cross-sectional views showing intermediate stages for forming a semiconductor device in accordance with some other embodiments of the present disclosure.

FIG. 4A to FIG. 4E are schematic cross-sectional views showing intermediate stages for forming a semiconductor device in accordance with some other embodiments of the present disclosure. Reference is made to FIG. 4A. An intermediate structure similar to that of FIG. 3H is provided. Elements of FIG. 4A to FIG. 4E that are similar to those of FIG. 3A to FIG. 3P are denoted by similar reference numbers. For example, in FIG. 4A, a semiconductor substrate 410, metal gate stacks 420 (including a metal gate layer 422, a work function metal layer 424 and a gate dielectric layer 426), spacer structures 430 (including a liner layer 432, a spacer layer 434 and a CESL 436) and an ILD layer 440 are respectively similar to the semiconductor substrate 310, the metal gate stacks 320 (including the metal gate layer 322, the work function metal layer 324 and the gate dielectric layer 326), the spacer structures 330 (including the liner layer 332, the spacer layer 334 and the CESL 336) and the ILD layer 340 of FIG. 3H. Similar to FIG. 3L, a water film 450 is formed over the top surfaces of the ILD layer 440, the metal gate stacks 420 and the spacer structures 430, such that the water is in direct contact with the ILD layer 440, the metal gate stacks 420 and the spacer structures 430. The water film 450 protects the metal gate stacks 420 and the spacer structures 430 from being in direct contact with the neutral $NF_3$ radicals which will be applied later, in which the direct contact may cause damages to the metal gate stacks 420 and the spacer structure 330. The difference between FIG. 4A and FIG. 3L is in that no hard mask is formed over the metal gate stacks 420 of FIG. 4A.

Figure 4B:
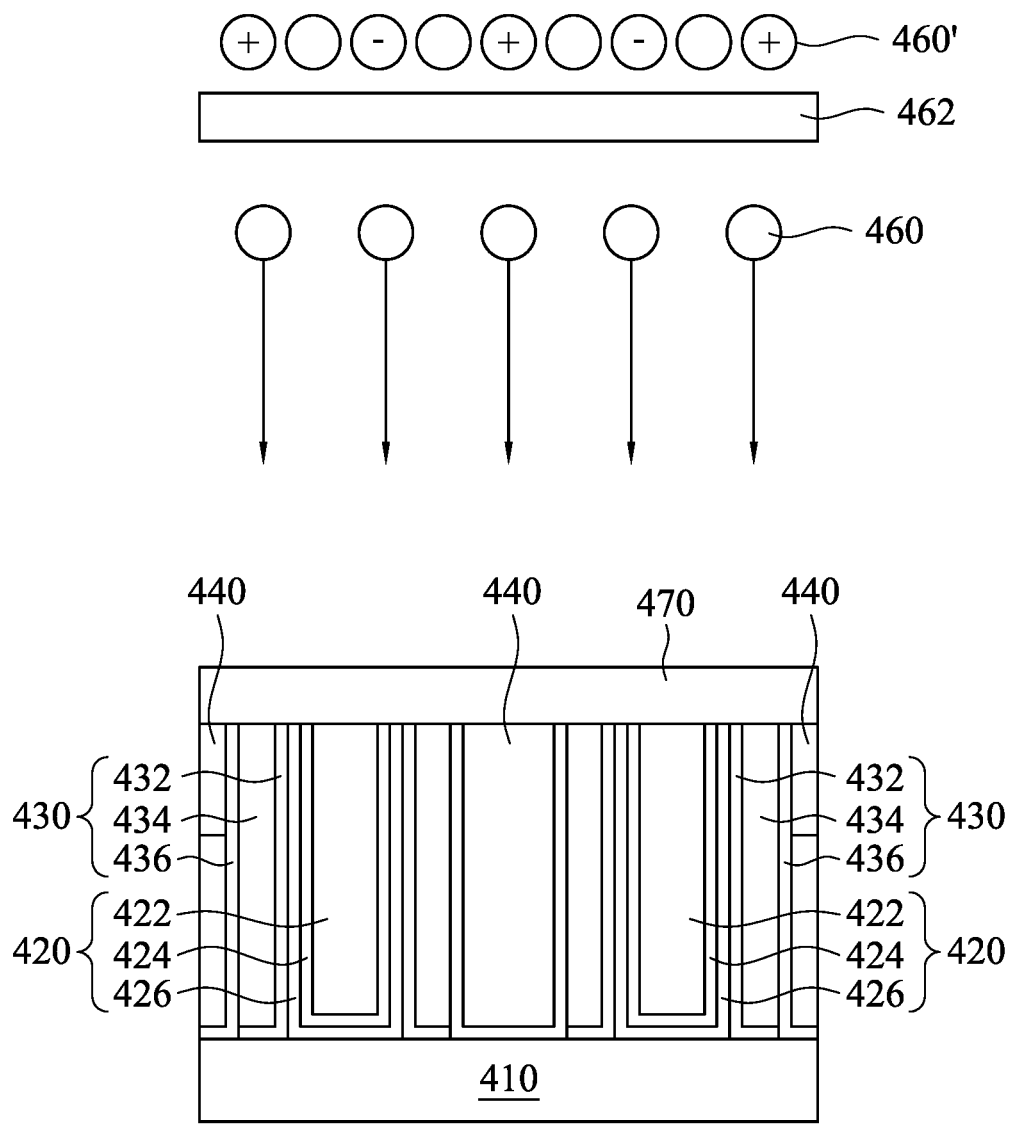
Figure 4C:
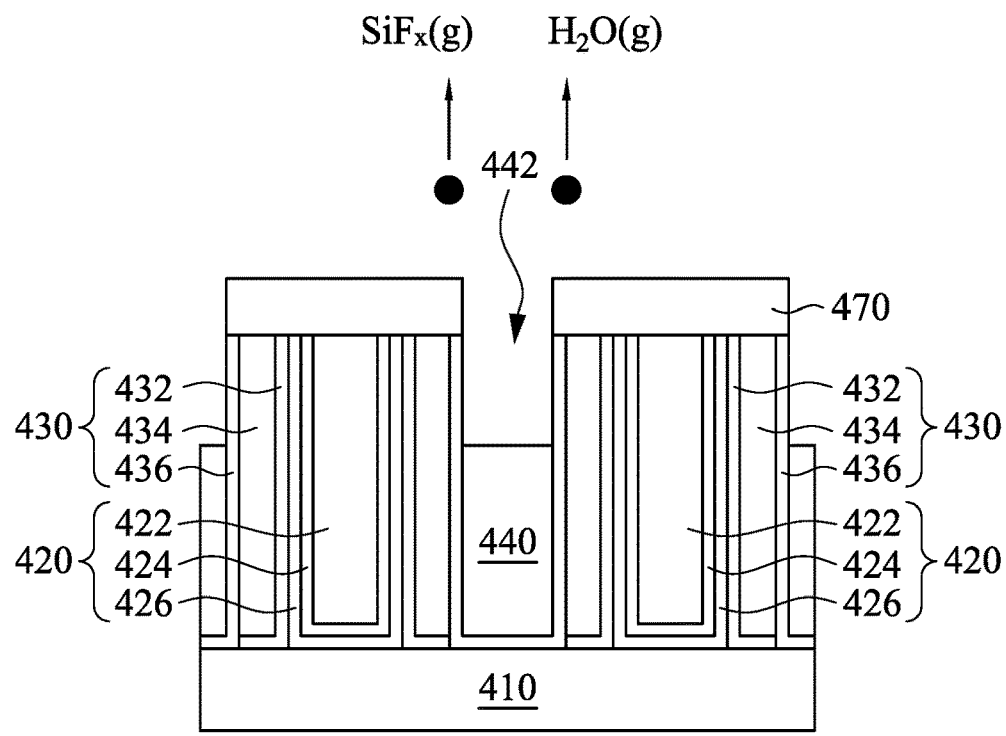

Reference is made to FIG. 4B. Then, similar to the operation of FIG. 3M, neutral $NF_3$ radicals 460 are formed and injected into the water film 450, thereby forming $HF_2^-$ ions over the top surfaces of the ILD layer 440, the metal gate stacks 420, and the spacer structure 430, such that a portion of the ILD layer 440 is selectively removed by an etching operation using the $HF_2^-$ ions (FIG. 4C). Details for the etching operation, the formation of the $HF_2^-$ ions (i.e. removing the charged ions of the $NF_3$ plasma 460' using a metal filter 462) or other process conditions are similar to those described in FIG. 3L and FIG. 3M, and may not be repeated herein.

Reference is made to FIG. 4C. Similar to FIG. 3N, an upper portion of the ILD layer 440 is removed to form recesses 442 by the $HF_2^-$ ions of the $HF_2^-$ ion film 470. The spacer structures 430 and the metal gate stacks 420 remain substantially unetched because the $HF_2^-$ ions have a high etch selectivity of the ILD layer 440 to the metal gate stacks 420 and the spacer structure 430. In some embodiments, the ILD layer 440 is etched at the first etching rate, the metal gate stacks 420 is etched at a fourth etching rate, and a ratio of the first etching rate to the fourth etching rate (i.e. the etch selectivity of the ILD layer 440 to the metal gate layer 422, the work function metal layer 424, and the gate dielectric layer 426) is greater than or equal to about 100. Therefore, the recesses 442 may be formed without causing damages to the metal gate layer 422, the work function metal layer 424, the gate dielectric layer 426 and the spacer structures 430.

Figure 4D:
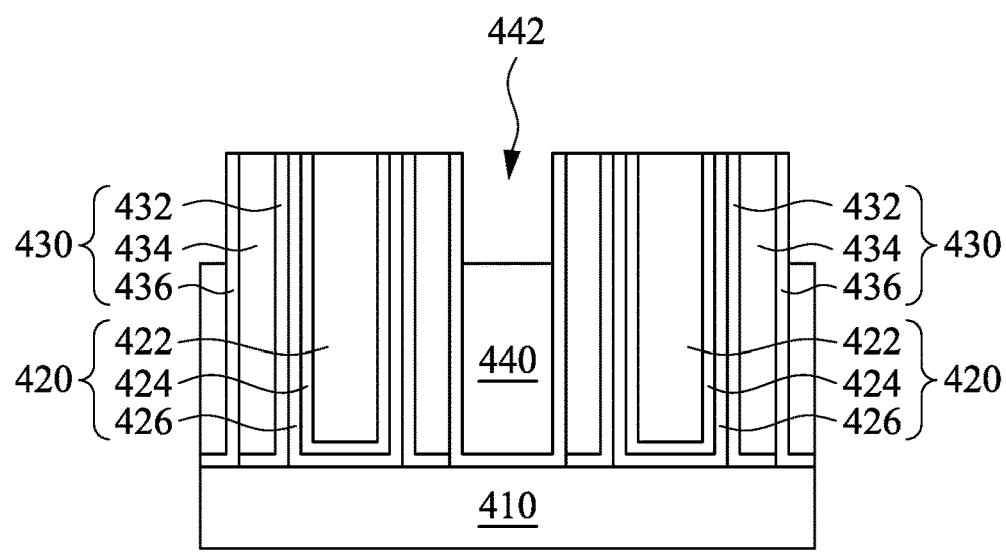
Figure 4E:
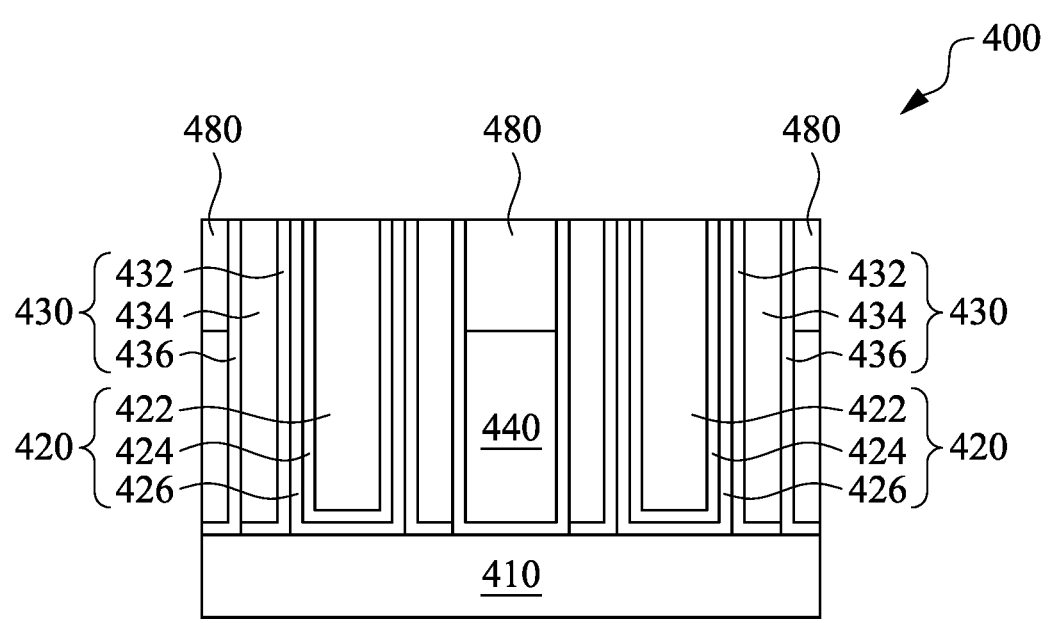

Reference is made to FIG. 4D. Similar to FIG. 3O, a purge process may be performed to remove the gaseous byproducts and the remaining etchant (i.e. the $HF_2^-$ ions) after the etching operation is performed. In some embodiments, a gas used for the purge process may include a nitrogen gas ($N_2$). Then, similar to FIG. 3P, a dielectric layer 480 may be formed over the ILD layer 440 after the etching operation, so as to form a semiconductor device 400, as shown in FIG. 4E.

Table 1 provides some examples of selectivity between different materials using the etching operation of FIG. 3L to FIG. 3O. The selectivity is obtained from a ratio of an etching rate of the material (e.g. A-1, A-6 or A-7) to an etching rate of the other material (e.g. A-1 through A-7).

TABLE 1

| selectivity | 1<br>A-7/A-n | 2<br>A-6/A-n | 3<br>A-1/A-n |
|---|---|---|---|
| A-1 | 0.8 | 1.3 | 1 |
| A-2 | 202.6 | 327.54 | 251.35 |
| A-3 | 8535.1 | 13796 | 10586.88 |
| A-4 | 30.2 | 48.83 | 37.47 |
| A-5 | 320.4 | 517.81 | 397.41 |
| A-6 | 0.6 | 1 | 0.8 |
| A-7 | 1 | 1.62 | 1.24 |

A-1 SiOCN with a carbon concentration less than about 2 at. %
A-2 SiOCN with a carbon concentration higher than about 2 at. %
A-3 SiCN deposited by PECVD
A-4 SiN deposited by ALD
A-5 SiN deposited by thermal ALD
A-6 $SiO_2$ deposited by ALD
A-7 $SiO_2$ deposited by thermal oxidation followed by a pre-clean process
n an integer of 1-7

As shown in Table 1, the etching operation has sufficient etching selectivity of the materials of A-1, A-6 and A-7, with respect to the materials of A-2, A-3, A-4 and A-5.

Figure 5:
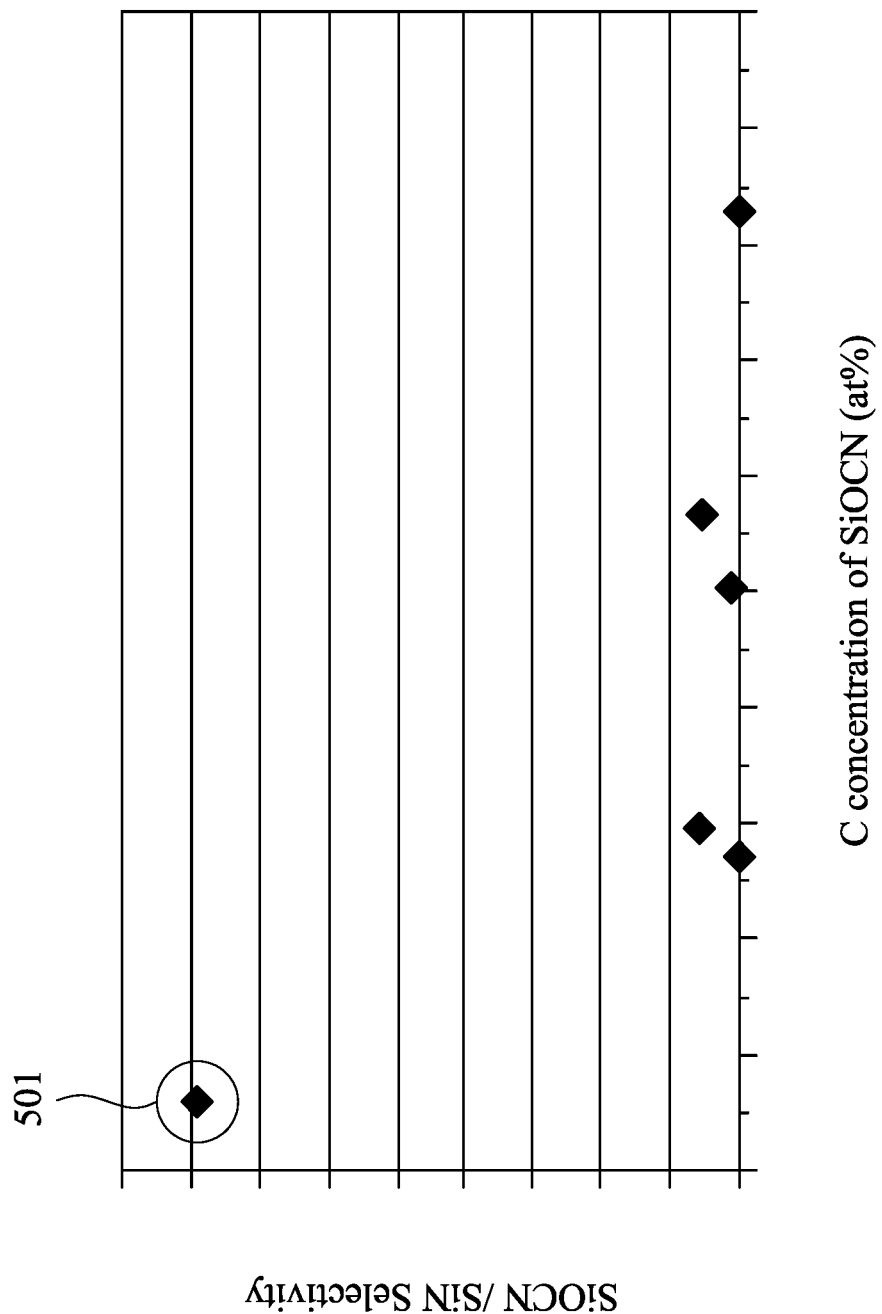
FIG. 5 is a distribution chart showing a relationship between carbon concentration of SiOCN and etching selectivity of SiOCN with respect to SiN.

Referring to FIG. 5, FIG. 5 is a distribution chart showing a relationship between carbon concentration of SiOCN and etching selectivity of SiOCN to SiN (A-5 of Table 1). As shown in FIG. 5, when SiOCN has the carbon concentration that is smaller than or equal to about 2 at. %, the etch selectivity of SiOCN to SiN is relatively high (e.g. SiOCN 501). On the other hand, when SiOCN has the carbon concentration greater than about 2 at. %, the etch selectivity of SiOCN to SiN becomes poor. Therefore, SiOCN having the carbon concentration that is smaller than or equal to about 2 at. % is suitable for forming the ILD layer 340.

Figure 6:
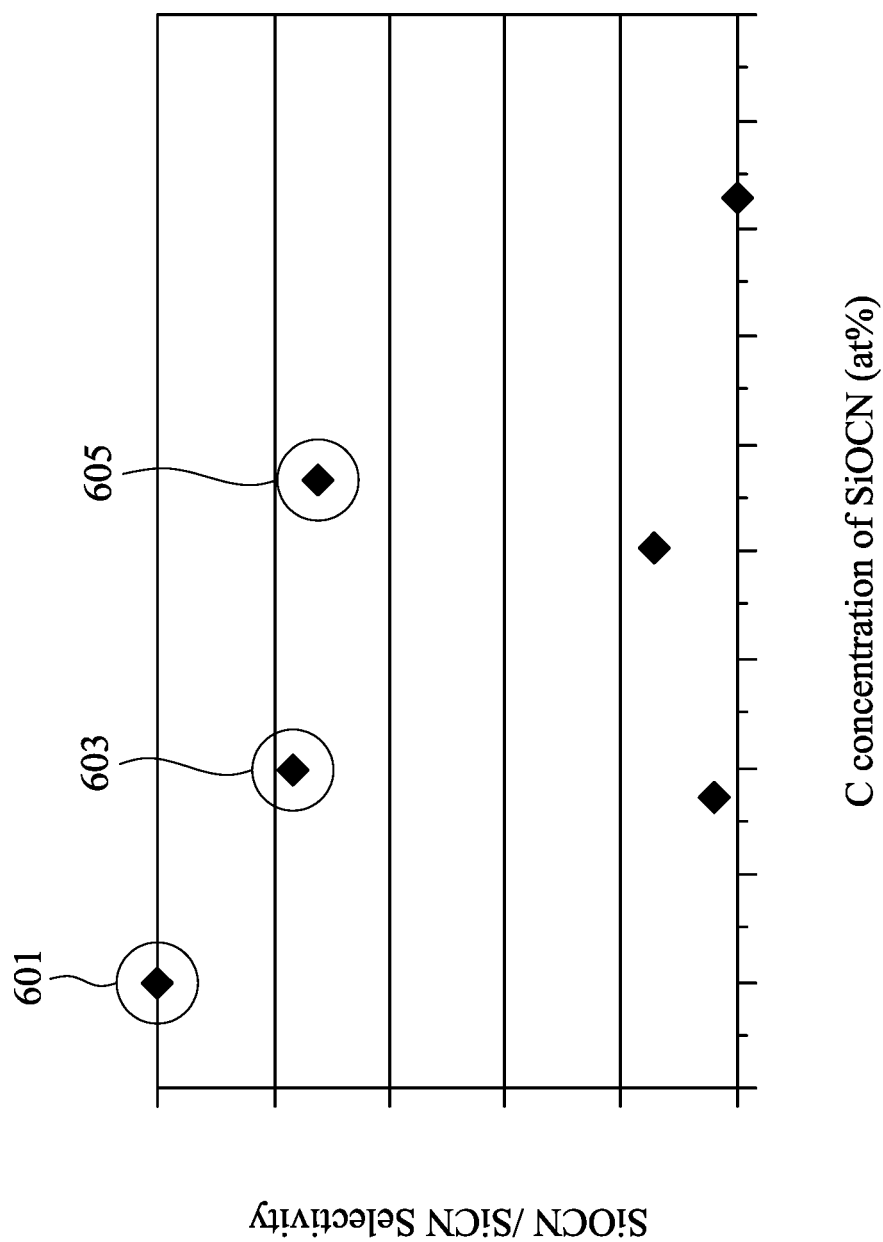
FIG. 6 is a distribution chart showing a relationship of carbon concentration of SiOCN and etching selectivity of SiOCN with respect to SiCN.

Referring to FIG. 6, FIG. 6 is a distribution chart showing a relationship between carbon concentration of SiOCN and etching selectivity of SiOCN to SiCN (A-3 of Table 1). As shown in FIG. 6, when SiOCN has the carbon concentration that is smaller than or equal to about 2 at. %, the etch selectivity of SiOCN to SiCN is sufficient (e.g. SiOCN 601). Furthermore, SiOCN 603 and SiOCN 605 each has a high carbon concentration (greater than or equal to about 6 at. %), while the etching selectivity of SiOCN 603 and SiOCN 605 to SiCN is sufficient because the SiOCN 603 and the SiOCN 605 each has a high oxygen concentration (greater than or equal to about 30 at. %).

The ILD layer is etched using $HF_2^-$ ions formed from water and neutral $NF_3$ radicals. A water film is formed over the ILD layer, the metal gate stacks and the spacer structures first to prevent the neutral $NF_3$ radicals from being in contact with the metal gate stacks and the spacer structures. Using the $HF_2^-$ ions to etch the ILD layer can efficiently improve the etch selectivity of the ILD layer to the metal gate stacks and the spacer structures, and byproducts of etching the ILD layer are gaseous rather than solid. Removal of the gaseous byproducts is much easier and can be performed without interrupting the etching operation.

In some embodiments, a method is provided. Dummy gate stacks are formed over a semiconductor substrate. An interlayer dielectric (ILD) layer is formed over the dummy gate stacks. A first portion of the ILD layer over top surfaces of the dummy gate stacks is removed, such that a second portion of the ILD layer remains between the dummy gate stacks. The dummy gate stacks are replaced with metal gate stacks. Water is applied over top surfaces of the second portion of the ILD layer and the metal gate stacks. Neutral $NF_3$ radicals into the water are applied to etch the ILD layer.

In some embodiments, a method is provided. A dummy gate stack is formed over a semiconductor substrate. An interlayer dielectric (ILD) layer is formed over the dummy gate stack. A first portion of the ILD layer over a top surface of the dummy gate stack is removed, such that a second portion of the ILD layer remains around the dummy gate stack. The dummy gate stack is replaced with a metal gate stack. The ILD layer using $HF_2^-$ is etched.

In some embodiments, a method is provided. A dummy gate stack is formed over a semiconductor substrate. A spacer is formed over a sidewall of the dummy gate stack. An interlayer dielectric (ILD) layer is formed over the dummy gate stack and the spacer structure. The ILD layer is polished until a top surface of the dummy gate stack is exposed. The dummy gate stack is replaced with a metal gate stack. The ILD layer is etched using water and neutral $NF_3$ radicals, in which etching the ILD layer has a first etching rate of the ILD layer and a second etching rate of the spacer, and a ratio of the first etching rate of the ILD layer to the second etching rate of the spacer is greater than about 30.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming dummy gate stacks over a semiconductor substrate;
    forming an interlayer dielectric (ILD) layer over the dummy gate stacks;
    removing a first portion of the ILD layer over top surfaces of the dummy gate stacks, such that a second portion of the ILD layer remains between the dummy gate stacks;
    replacing the dummy gate stacks with metal gate stacks;
    applying water over top surfaces of the second portion of the ILD layer and the metal gate stacks; and
    applying neutral $NF_3$ radicals into the water to etch the ILD layer.

2. The method of claim 1, further comprising:
    forming a $NF_3$ plasma comprising charged $NF_3$ ions and the neutral $NF_3$ radicals; and
    removing the charged $NF_3$ ions from the $NF_3$ plasma.

3. The method of claim 1, wherein a flow rate of the water is in a range from 1 gm to 3 gm.

4. The method of claim 1, wherein a flow rate of the neutral $NF_3$ radicals is in a range from 30 sccm to 140 sccm.

5. The method of claim 1, wherein the ILD layer comprises carbon, and a carbon concentration of the ILD layer is smaller than or equal to 2 at. %.

6. The method of claim 1, wherein the water comprises water vapor.

7. The method of claim 1, wherein the water comprises liquid water.

8. The method of claim 1, further comprising:
    prior to applying the water, recessing the metal gate stacks to fall below the top surface of the second portion of the ILD layer; and
    forming separate hard masks respectively over the recessed metal gate stacks, wherein the water is further applied over the hard masks.

9. A method, comprising:
    forming a dummy gate stack over a semiconductor substrate;
    forming an interlayer dielectric (ILD) layer over the dummy gate stack;
    removing a first portion of the ILD layer over a top surface of the dummy gate stack, such that a second portion of the ILD layer remains around the dummy gate stack;
    replacing the dummy gate stack with a metal gate stack;
    introducing water vapor to the ILD layer to form a water film; and
    after forming the water film, injecting neutral $NF_3$ radicals into the water film to etch the ILD layer.

10. The method of claim 9, further comprising:
    forming a spacer layer over a sidewall of the dummy gate stack,
    wherein etching the ILD layer has a first etching rate of the ILD layer and a second etching rate of the spacer layer, and a ratio of the first etching rate of the ILD layer to the second etching rate of the spacer layer is greater than 30.

11. The method of claim 9, wherein etching the ILD layer has a first etching rate of the ILD layer and a second etching rate of the metal gate stack, and a ratio of the first etching rate of the ILD layer to the second etching rate of the metal gate stack is greater than 100.

12. The method of claim 9, wherein etching the ILD layer is performed at a temperature in a range from 0° C. to 110° C.

13. A method, comprising:
    forming a dummy gate stack over a semiconductor substrate;
    forming a spacer layer over a sidewall of the dummy gate stack;
    forming an interlayer dielectric (ILD) layer over the dummy gate stack and the spacer layer;
    polishing the ILD layer until a top surface of the dummy gate stack is exposed;
    replacing the dummy gate stack with a metal gate stack; and
    etching the ILD layer using water and neutral $NF_3$ radicals, wherein etching the ILD layer has a first etching rate of the ILD layer and a second etching rate of the spacer layer, and a ratio of the first etching rate of the ILD layer to the second etching rate of the spacer layer is greater than 30.

14. The method of claim 13, further comprising:
    forming a hard mask layer over the metal gate stack,
    wherein etching the ILD layer has a third etching rate of the hard mask layer, and a ratio of the first etching rate of the ILD layer to the third etching rate of the hard mask layer is greater than 30.

15. The method of claim 13, further comprising:
    forming a hard mask layer over the metal gate stack,
    wherein etching the ILD layer is performed such that the water is in direct contact with the hard mask layer.

16. The method of claim 13, wherein etching the ILD layer is performed such that the water is in direct contact with the spacer layer.

17. The method of claim 13, wherein etching the ILD layer is performed such that the water is in direct contact with the ILD layer.

18. The method of claim 13, wherein a carbon concentration of the ILD layer is lower than a carbon concentration of the spacer layer.

19. The method of claim 13, wherein a byproduct of etching the ILD layer is gaseous.

20. The method of claim 13, wherein the spacer layer comprises carbon, and a carbon concentration of the spacer layer is greater than 2 at. %.

* * * * *